United States Patent [19]
Coffman

[11] Patent Number: 5,450,357
[45] Date of Patent: Sep. 12, 1995

[54] LEVEL SHIFTER CIRCUIT

[75] Inventor: Tim M. Coffman, Sugarland, Tex.

[73] Assignee: Texas Instruments Incorporated, Dallas, Tex.

[21] Appl. No.: 221,730

[22] Filed: Apr. 1, 1994

[51] Int. Cl.6 .................................. G11C 7/00
[52] U.S. Cl. ..................... 365/189.11; 365/230.06; 365/185; 326/62
[58] Field of Search ............ 365/189.11, 230.06, 365/185, 226; 307/475, 296.8; 326/62

[56] References Cited

U.S. PATENT DOCUMENTS

| | | | |
|---|---|---|---|
| 4,387,447 | 6/1983 | Klaas et al. | 365/203 |
| 4,642,798 | 2/1987 | Rao | 365/230 |
| 5,031,149 | 7/1991 | Matsumoto et al. | 365/189.11 |
| 5,132,565 | 7/1992 | Kuzumoto | 307/443 |
| 5,157,281 | 10/1992 | Santin et al. | 307/296.8 |
| 5,187,683 | 2/1993 | Gill et al. | 365/185 |
| 5,202,855 | 4/1993 | Morton | 365/189.11 X |
| 5,319,604 | 6/1994 | Imondi et al. | 365/230.06 |

Primary Examiner—Joseph A. Popek
Attorney, Agent, or Firm—Theodore D. Lindgren; Leo N. Heiting; Richard L. Donaldson

[57] ABSTRACT

A level shifter circuit 150 for selecting different voltage levels for programming memory cells 10 is provided. The level shifter 150 has an input 152 connected to a control circuitry and an output 154 connected to memory cells 10. The level shifter 150 is connected to two voltage sources: a high voltage source 166 and a low voltage source 164. The level shifter 150 has an isolation transistor 156 to buffer the input control circuitry from the higher voltage in the level shifter 150. Depending on the input control signal, either a first switching transistor 158 will select the low voltage source 164 for output or a second switching transistor 162 will select the high voltage source 166 for output. A pull-up transistor 162 is used to maintain the state of the switching transistors 158, 160 when the voltage sources 164, 166 ramp up. A voltage limiting transistor 170 reduces the voltage potential (breakdown voltage) across the drain and source terminals of the pull-up transistor 162.

5 Claims, 3 Drawing Sheets

LEVEL SHIFTER CIRCUIT

TECHNICAL FIELD OF INVENTION

This invention relates in general to the field of semiconductor memory devices and, more particularly, to a level shifter circuit for selecting different voltage levels for programming memory devices.

BACKGROUND OF THE INVENTION

Semiconductor memory devices, such as EEPROMS, EPROM, and flash memory, contain an array of programmable memory cells. Memory cells are programmed using different voltage levels, e.g., to write data into a memory cell, a relative high voltage level is applied to the memory cell. At the same time, a lower voltage level may be applied to other memory cells not being written to prevent disturbing the current data in the memory cells. The actual voltage levels required to program memory cells may vary depending on the types of memory devices. To apply different voltage levels to the memory cells, decoders with level shifter circuits may be used. Each decoder has several level shifter circuits, wherein one level shifter controls one set of memory cells. Depending on the desired programming function to be performed on a memory cell, the level shifter in the decoder will select the proper voltage level to program that memory cell.

In the prior art, a level shifter may be implemented using switching transistors. The switching transistors can select the desired output voltage level from two different voltage sources. For example, a high voltage source that provides a relatively high voltage level and a low voltage source that provides a lower voltage level, and both voltage sources provide voltage levels that ramp gradually from the low end of the range to the high end. For example, the low voltage source may provide voltage ranging from 0 to 7 volts, whereas the high voltage source may provide voltage level that ramps from 5 to 16 volts. Each level shifter is connected to a common set of high and low voltage sources. Depending on the programming function to be performed, each level shifter may select a different voltage source. In operation, regardless which voltage source is selected by a particular level shifter, both voltage sources will concurrently ramp up their respective voltage levels at the same rate in order to supply voltages to all of the level shifters. When the voltage sources ramp up, the voltage in the level shifter will change, thus affecting the switching state of the transistors. To maintain the state of the switching transistors, a pull-up transistor may be used to provide the necessary additional voltage to the switching transistors when the voltage sources are ramping up. Because of the relatively high voltage differential between the voltage sources, the pull-up transistor encounters a high voltage potential (or breakdown voltage) across its drain and substrate regions, which is commonly referred to as the break down voltage margin across the drain and source or BVDSS margin. Transistors having a high BVDSS margin are more difficult to manufacture and are more costly, because the manufacturing process requires low tolerances and high precision. Typically, for such transistors, the rejection rate is high and the yield rate is relatively low. Therefore, it would be a cost benefit to be able to utilize level shifters having pull-up transistors with lower BVDSS margin.

SUMMARY OF THE INVENTION

From the foregoing, it may be appreciated that a need has arisen for a level shifter circuit having a pull-up transistor with a low BVDSS margin. In accordance with the present invention, a method and apparatus are provided that substantially eliminate or reduce the problems and disadvantages associated with the conventional level shifter circuits.

In the present invention, the level shifter circuit has an input for receiving input control signals from a control circuitry for selecting the desired programming voltage level. The level shifter has an output for connecting the programming voltage level to the memory cells. An isolation transistor is used to buffer the control circuitry from the higher voltage in the level shifter circuit. The isolation transistor connects the input to the control gates of the first and second switching transistors. The switching transistors are connected to two voltage sources; specifically, the first switching transistor is connected to a low voltage source having voltage level that ramps from 0 to 7 volts, and the second switching transistor is connected to a high voltage source having voltage level that ramps from 5 to 16 volts. Depending on the input control signal, the first switching transistor may switch the low voltage source to the level shifter's output, or the second switching transistor may switch the high voltage source to the level shifter's output. A pull-up transistor is connected to the high voltage source and its control gate is connected to the level shifter's output. The pull-up transistor supplies additional voltage to the switching transistors to maintain the state of the switching transistors when the voltage sources are ramped up. A voltage limiting transistor is used to limit the voltage potential (break down voltage) across the pull-up transistor, thereby allowing the pull-up transistor to have a lower BVDSS requirement. The voltage limiting transistor is connected to the pull-up transistor and to the control gates of the first and second switching transistors. The voltage limiting transistor's control gate is connected to the low voltage source.

The present invention provides various technical advantages over the conventional level shifter circuits. For example, one technical advantage is that the voltage potential across the pull-up transistor is reduced, thereby reducing the requirement for a pull-up transistor with a high BVDSS margin. Another technical advantage is that transistors having a lower BVDSS margin are easier to manufacture and cost less.

BRIEF DESCRIPTION OF THE DRAWINGS

For a more complete understanding of the present invention and the advantages thereof, reference is now made to the following descriptions taken in conjunction with the accompanying drawings in which like reference numbers indicate like features and wherein.

DETAILED DESCRIPTION OF THE INVENTION

Figure 1:
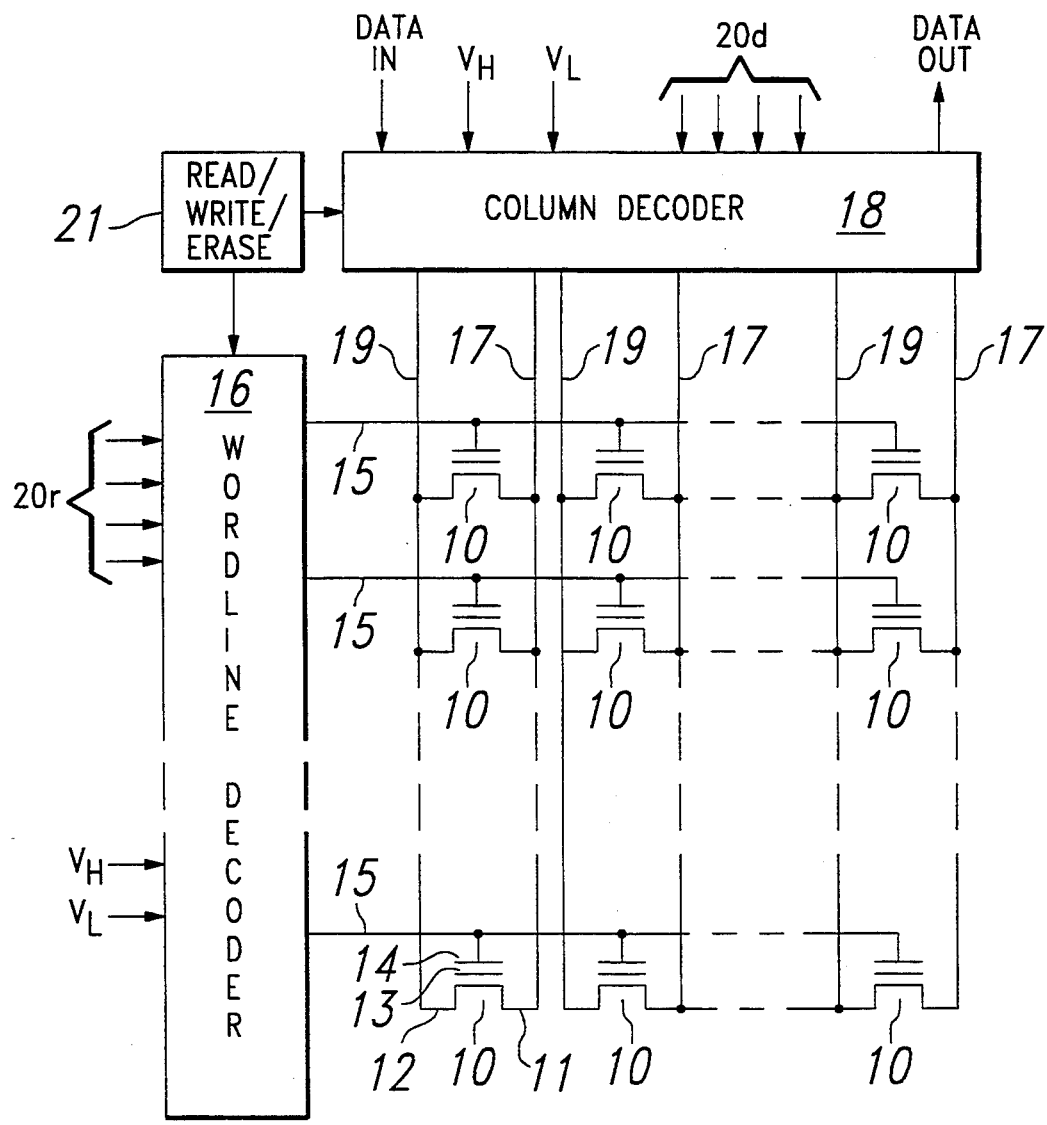
FIG. 1 is a diagram of an EEPROM memory device having an array of memory cells and using decoders to program the memory cells.

FIG. 1 illustrates an EEPROM memory device having an array of memory cells, wherein decoders are used for addressing and programming the memory cells. Each memory cell is a floating-gate transistor 10 having a source terminal 11, a drain terminal 12, a floating gate terminal 13 and a control gate terminal 14. Each of the control gate terminals 14 in a row of memory cells 10 is connected to a wordline 15, and each of the wordlines 15 is connected to a wordline decoder 16. Each of the source terminals 11 in a column of memory cells 10 is connected to a source-column line 17, and each of the source-column lines 17 is connected to a column decoder 18. Each of the drain terminals 12 in a column of memory cells 10 is connected to a drain-column line (bitline) 19, and each of the bitlines 19 is connected to the column decoder 18. A programming controller 21 is connected to the wordline decoder 16 and the column decoder 18. The wordline decoder 16 and the column decoder 18 are used in conjunction to address the desired memory cell 10 for programming (write operation) or retrieving data (read operation).

Using the wordline decoder 16 and the column decoder 18 to program memory cells, 10 is well known in the art. See, e.g., U.S. Pat. No. 5,187,683, issued to Gill et al., entitled "Method For Programming EEPROM Memory Arrays." In summary, to program the memory cells 10, different voltage levels are applied to the control gate terminals 14 of the transistors 10. For example, in a memory write operation, the wordline decoder 16 may function, in response to wordline address signals on lines 20r and to a signal from the programming controller 21, to place a high programming voltage $V_h$ on a selected wordline 15. The programming controller 21 acts in response to inputs on lines 22 from a control circuitry (not shown). Similarly, in a memory read operation, the wordline decoder 16 functions, in response to wordline address signals on lines 20r and to a signal from the programming controller 21, to apply a low programming voltage $V_L$ to the selected wordline 15.

Figure 2:
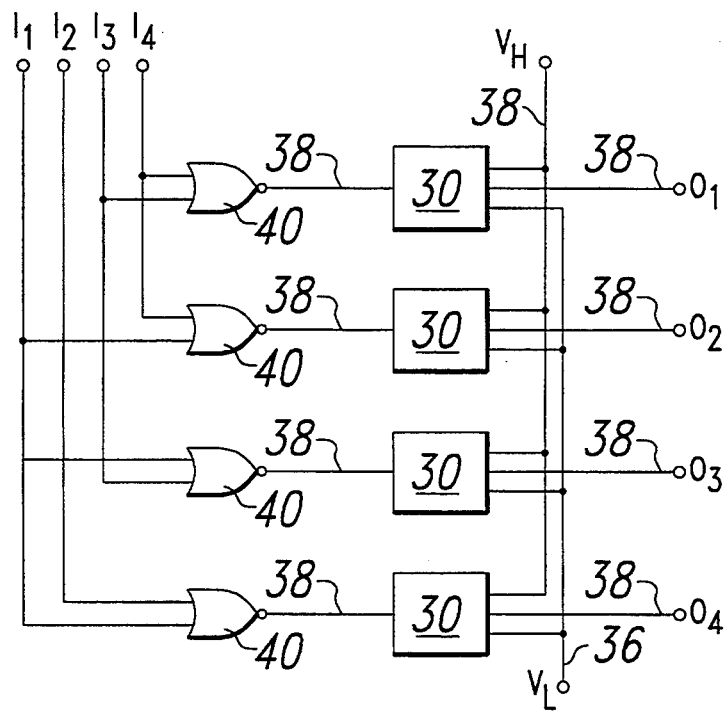
FIG. 2 is a diagram of a decoder having level shifter circuits for selecting the voltage levels to program the memory cells.

The wordline decoder 16 may be implemented using level shifter circuits. FIG. 2 illustrates a decoder 28 which may function as the wordline decoder 16 illustrated in FIG. 1. The decoder 28 comprises four level shifter circuits 30, wherein the output 32 of each level shifter circuit 30 drives one wordline or column of memory cells. ($O_1$, $O_2$, $O_3$, $O_4$). The four level shifter circuits 30 are identical and perform identical functions. Two voltage sources are connected to the level shifters: a high voltage source 34 and a low voltage source 36, which are represented as $V_h$ and $V_L$ in FIG. 1, respectively. The input 38 of each level shifter 30 is connected to a NAND gate 40, which receives input control signals ($I_1$, $I_2$, $I_3$, $I_4$) from the control circuitry (not shown). Depending on the input control signals, as shown below in Table 1, wherein "1" represents a control signal of 5 volts, and "0" represents 0 volt, each level shifter 30 may select either the high voltage source 34 (represented as "H") or the low voltage source 36 (represented as "L") for output to its memory cells 10.

TABLE 1

| Input Control Signals | | | | Output Voltages | | | |
|---|---|---|---|---|---|---|---|
| $I_1$ | $I_2$ | $I_3$ | $I_4$ | $O_1$ | $O_2$ | $O_3$ | $O_4$ |
| 0 | 1 | 0 | 1 | H | L | L | L |

TABLE 1-continued

| Input Control Signals | | | | Output Voltages | | | |
|---|---|---|---|---|---|---|---|
| $I_1$ | $I_2$ | $I_3$ | $I_4$ | $O_1$ | $O_2$ | $O_3$ | $O_4$ |
| 1 | 0 | 0 | 1 | L | H | L | L |
| 0 | 1 | 1 | 0 | L | L | H | L |
| 1 | 0 | 1 | 0 | L | L | L | H |

Figure 3:
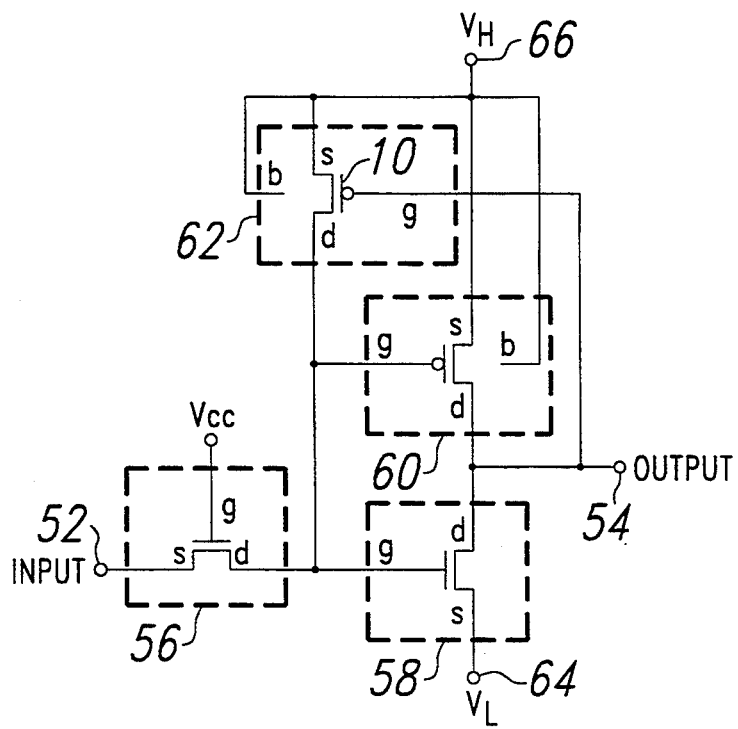
FIG. 3 is a schematic diagram of a prior art level shifter circuit.

FIG. 3 illustrates a prior art level shifter circuit. 50 that may be used as the level shifter 30 in the decoder 28 illustrated in FIG. 2. The level shifter 50 has an input 52 for selecting the desired programming voltage level and an output 54 where the selected voltage is connected to the memory cells 10 (not shown; see FIG. 1). The level shifter 50 comprises four transistors: an isolation transistor 56, a first switching transistor 58, a second switching transistor 60, and a pull-up transistor 62. The level shifter 50 is connected to two voltage sources having different voltage levels: a low voltage source 64 having a voltage level that ramps from 0 to 7 volts and a high voltage source 66 having a voltage level that ramps from 5 to 16 volts. Typically, the voltage sources are charge pumps, which are voltage multipliers connected to a 5-volt power supply. The isolation transistor 56 is an N-type transistor having a source terminal 56s, a drain terminal 56d, and a control gate terminal 56c. Its source terminal 56s is connected to the input 52; the control gate terminal 56c is connected to $V_{cc}$ 68, which is a 5-volt power supply, and the drain terminal 56d is connected to the switching transistors 58, 60. The isolation transistor 56 buffers the input control circuitry (not shown) from the higher voltage levels in the level shifter circuit 50. The first switching transistor 58 is used to switch the low voltage source 64 to the output 54. The first switching transistor 58 is an N-type transistor having a drain terminal 58d, a source terminal 58s, and a control gate terminal 58c. Its control gate terminal 58c is connected to the drain terminal 56d of the isolation transistor 56; the source terminal 58s is connected to the low voltage source 64, and the drain terminal 58d is connected to the output 54. The second switching transistor 60 is used to switch the high voltage source 66 to the output 54. The second switching transistor 60 is a P-type transistor having: a drain terminal 60d, a source terminal 60s, and a control gate terminal 60c. The control gate terminal 60c is connected to the drain terminal 56d of the isolation transistor 56; the drain terminal 60d is connected to the output 54, mid the source terminal 60s is connected to the high voltage source 66. In addition, as a P-type transistor, the second switching transistor 60 has a bulk terminal 60b, which is connected to the high voltage source 66 and provides a conductive channel in the substrate of the transistor 60 to allow electrical connection between the source and drain terminals 60s, 60d of the transistor 10.

To select the low voltage source 64 for output 54 to the memory cells 10, a control signal of 5 volts from the control circuitry is applied to the input 52. The control signal is passed through the isolation transistor 56 and applied on the control gate terminals 58c, 60c of the first and second switching transistors 58, 60. The isolation transistor 56 prevents the flow of higher voltage in the level shifter 50 into the control circuitry. The isolation transistor 56 is an N-type transistor with its control gate 56c connected to $V_{cc}$ 68, which is typically a 5-volt power supply. When the voltage in the level shifter 50 is less than 5 volts, the isolation transistor 56 remains "on," because the voltage at the control gate 56c is higher than the voltage at the drain terminal 56d, and allows electrical current to flow between its source terminal 56s and drain terminal 56d. When the drain terminal 56d experiences voltage greater than 5 volts, the isolation transistor 56 will "turn off," because the voltage at the control gate 56c is less than the voltage at the, drain terminal 56d, and block the flow of current from the drain terminal 56d to the source terminal 56s to prevent higher voltage from entering the control circuitry.

When the control signal of 5 volts is applied to the control gate 58c of the first switching transistor 58, which is an N-type transistor, the first switching transistor 58 will "turn on," because the voltage at the control gate 58c is higher than the voltage at the source terminal 58s, and allow electrical current to flow from its source terminal 58s to its drain terminal 58d. On the other hand, when 5 volts is applied to the control gate 60c of the second switching transistor 60, which is a P-type transistor, it will "turn off," because the voltage at the control gate 60c is less than the voltage at the source terminal 60s, and block the electrical flow between its drain terminal 60d and source terminal 60s. As a result, the high voltage source 66 is blocked by the second switching transistor 60, and the first switching transistor 58 connects the low voltage source 64 to the output 54. Similarly, to select the high voltage source 66 for output 54 to the memory cells 10, a low control signal of 0 volt is applied to the input 52. The isolation transistor 56 passes the control signal to the switching transistors 58, 60. When input is at 0 volt, the first switching transistor 58 turns off because the voltage at the control gate terminal 58c is the same or less than the voltage at the source terminal 58s, which is connected to the low voltage source 64. When the input is at 0 volt, however, the second switching transistor 60 turns on because the voltage at the control gate 60c is lower than the voltage at the source terminal 60s and connects the high voltage source 66 to the output 54. As a result, the high voltage source 66 is selected as the programming voltage for the memory cells.

The pull-up transistor 62 is needed to maintain the state of the switching transistors 58, 60. During each memory programming cycle, both voltage sources 64, 66 will gradually and concurrently ramp their respective voltage levels from the low end to the high end and then back to the low end again at the end of one programming cycle. In other words, the high voltage source 66 will ramp from 5 to 16 volts, and concurrently, the low voltage source 64 will ramp from 0 to 7 volts. As the voltage sources 64, 66 ramp up, the voltage in the level shifter circuit 50 will change, thereby affecting the voltage level at the control gate terminals 58c, 60c of the switching transistors 58, 60 and changing the switching state of the switching transistors 58, 60. In other words, if a switching transistor is currently on, the changing voltage level will cause it to turn off, and vice versa. In order to maintain the switching state of the switching transistors 58, 60 during a programming cycle, the pull-up transistor 62 is used to provide additional voltage to the control gate terminals 58c, 60c of the switching transistors 58, 60. Without additional voltage to the control gate terminals 58c, 60c as the voltage sources 64, 66 ramp up, the switching transistors 58, 60 will lose their state due to the change, in the voltage level in the level shifter circuit 50 and disconnect the selected voltage source from the output 54. This would result in the loss of the proper programming voltage level to the, memory cells, and would abort the programming function.

Referring to FIG. 3, the pull-up transistor 62, a P-type transistor, is connected to the control gate terminals 58c, 60c of the switching transistors 58, 60 to provide sufficient voltage to maintain their existing state. The pull-up transistor's 62 drain terminal 62d is connected to the control gate terminals 58c, 60c of the first and second switching transistors 58, 60, and its source terminal 62s is connected to the high voltage source 66; the control gate terminal 62c is connected to the output 54, which controls the timing of supplying additional pull-up voltage to the switching transistors 58, 60; and the bulk terminal 62b is connected to the high voltage source 66. The pull-up transistor 62 will turn on when the voltage all its control gate terminal 62c is lower than the voltage at its source terminal 62s. When the high voltage source 66 is selected, i.e., the first switching transistor 58 is off and the second switching transistor 60 is on, the pullup transistor 62 will remain off because the voltage at its control gate 62c remains the same as the voltage at its source terminal 62s. When the low voltage source 64 is selected, however, the pull-up transistor 62 will turn on because the voltage at its control gate 62c is lower than the voltage at its source terminal 62s and will provide the necessary additional voltage to the first switching transistor 58 to maintain its "on" state and to the second switching transistor 60 to maintain its "off" state.

To maintain the state of the switching transistor, 58, 60, the pull-up transistor 62 experiences high voltage potential (or breakdown voltage) across its drain and source terminals. This occurs because the voltage differential between the high voltage source 66 and the low voltage source 64 is relatively high. To maintain the state of the switching transistors 58, 60, the pull up transistor 62 must tolerate this high voltage differential or BVDSS condition. In the present invention, a voltage limiting transistor is provided to reduce the BVDSS margin experienced by the pull-up transistor 62.

Figure 4:
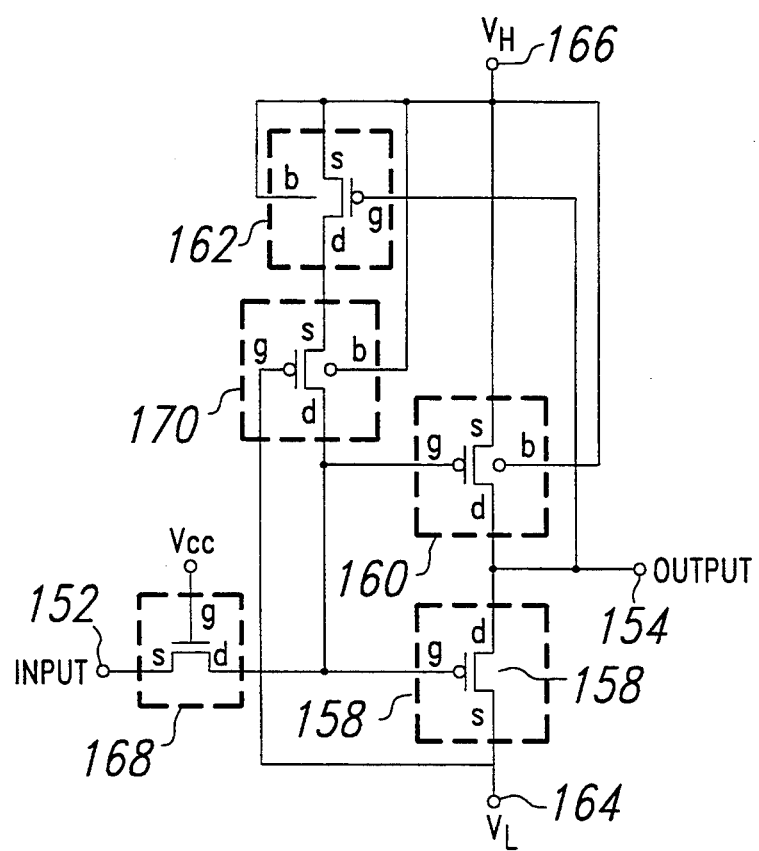
FIG. 4 is a schematic diagram of a level shifter according to a preferred embodiment of the present invention.

FIG. 4 illustrates a level shifter circuit 150 in accordance with a preferred embodiment of the present invention. The level shifter 150 has all of the elements described in the prior art circuit shown in FIG. 3 with like elements in FIG. 4 having 100 added to the reference numerals in FIG. 3. In addition, a voltage limiting transistor 170 is incorporated in the level shifter 150 to reduce the BVDSS margin across the pull-up transistor 162. Referring to FIG. 4, the voltage limiting transistor 170, a P-type transistor, having a drain terminal 170d, a source terminal 170s, and a control gate terminal 170c, is inserted between the drain terminal 162d of the pull-up transistor 162 and the control gate terminals 158c, 160c of the switching transistors 158, 160. In particular, the source terminal 170s is connected to the drain 162d of the pull-up transistor 162; the drain terminal 170d is connected to the control gate terminals 158c, 160c of the first and second switching transistors 158, 160; the control gate terminal 170c is connected to the low voltage source 164; and the bulk terminal 170b is connected to the high voltage source 164. With respect to the connections of the other elements, i.e, the isolation transistor 156, the first switching transistor 158, the second switching transistor 160, and the pull up transistor 162, those elements are configured with each other in the same manner as illustrated in FIG. 3.

The addition of the voltage limiting transistor 170 does not affect the operation of the first and second switching transistors 158, 160. To select the high voltage source 164, a low control signal of 0 volt is applied to the input 152. The low control signal is passed through the isolation transistor 156 to the control gate terminals 158c, 160c of the switching transistors 158, 160. A low control signal will turn off the first switching transistor 158, thereby blocking the low voltage source 164. On the other hand, the low control signal will turn on the second switching transistor 160 and connect the high voltage source 166 to the output 154. Both the pull-up transistor 162 and the voltage limiting transistor 170 will remain off. To select the low voltage source 164, a control voltage of 5 volts is applied to the input 152. A control voltage of 5 volts will turn on the first switching transistor 158 and turn off the second switching transistor 160. As a result, the low voltage source 164 is selected for output to the memory cells (not shown). The pull-up transistor 162 will turn on, along with the voltage limiting transistor 170, to provide additional voltage to the switching transistors 158, 160.

When the high voltage source 166 is selected, the voltage limiting transistor 170 serves to limit the voltage potential (or the breakdown voltage) across the pull-up transistor 162. When the low voltage source 164 is selected, however, the voltage limiting transistor 170 does not affect the pull-up transistor 162 because the voltage potential across the pull-up transistor 162 is minimal. By adding the voltage limiting transistor 170, the voltage potential across the pull-up transistor 162 is reduced. Without the voltage limiting transistor 170, the voltage potential across the pull-up transistor 162 is the difference between the high voltage source 166 and the input control signal, which is 0 volt. As the high voltage source 166 ramps up to 16 volts, the voltage potential increases to 16 volts. By adding the voltage limiting transistor 170, the maximum voltage potential across the pull-up transistor 162 becomes the difference between the maximum voltage from the high voltage source 166 (which is 16 volts) and the maximum voltage from the low voltage source 164 (which is 7 volts). As a result, the maximum voltage potential across the pull-up transistor 162 when the high voltage source 166 is selected is 9 volts, instead of 16 volts. Accordingly, with the voltage limiting transistor 170 in place, the BVDSS margin requirement for the pull-up transistor 162 is lowered because the voltage potential across the pull-up 162 transistor is reduced.

Thus, it is apparent that there has been provided, in accordance with the present invention, a method and apparatus for providing a level shifter circuit that satisfies the advantages set forth above. Although the preferred embodiment has been described in detail, it should be understood that various changes, substitutions, and alterations can be made herein. For example, different transistors may be used for switching and isolating to provide substantially the same functions. Furthermore, other examples may be readily ascertainable by one skilled in the art and could be made without departing from the spirit and scope of the, present invention as defined by the following claims.

What is claimed is:

1. A circuit for selecting different voltage levels, comprising:

an input for receiving control signals for selecting a voltage level;

an output;

an isolation transistor connected to the input;

a first switching transistor connected to the isolation transistor, a low voltage source, and the output, wherein the first switching transistor will switch the low voltage source to the output in response to a first control signal from the input;

a second switching transistor connected to the isolation transistor, a high voltage source, and the output, wherein the second switching transistor will switch the high voltage source to the output in response to a second control signal from the input;

a pull-up transistor connected to the high voltage source, the first and second switching transistors, and the output, wherein the pull-up transistor will maintain the switching state of the first and second switching transistors once the high or low voltage source has been selected; and a voltage-limiting transistor connected to the pull-up transistor, the low voltage source, and the first and second switching transistors, wherein the voltage-limiting transistor will limit the voltage potential across the pull-up transistor.

2. The circuit of claim 1, wherein the isolation transistor is an N-type transistor, the first switching transistor is an N-type transistor, the second switching transistor is a P-type transistor, the pull-up transistor is a P-type transistor, and the voltage-limiting transistor is a P-type transistor.

3. A level shifter circuit for selecting different voltage levels for programming memory cells, the level shifter circuit comprising:

an input for receiving a first and second control signal for selecting a voltage level;

an output connected to the memory cells;

an isolation transistor having a source terminal, a drain terminal, and a control gate terminal, the source terminal connected to the input and the control gate terminal connected to a control voltage source;

a first switching transistor having a source terminal, a drain terminal, and a control gate terminal, the control gate terminal of said first switching transistor connected to the drain terminal of said isolation transistor, the source terminal of said first switching transistor connected to a low voltage source, and the drain terminal of said first switching transistor connected to the output, wherein the first switching transistor will switch the low voltage source to the output in response to the first control signal from the input;

a second switching transistor having a source terminal, a drain terminal, a control gate terminal, and a bulk terminal, the control gate terminal of said second switching transistor connected to the drain terminal of said isolation transistor, the source terminal of said second switching transistor connected to a high voltage source, the drain terminal of said second switching transistor connected to the output, and the bulk terminal of said second switching transistor connected to the high voltage source, wherein the second switching transistor will switch the high voltage source to the output in response to the second control signal from the input;

a pull-up transistor having a drain terminal, a control gate terminal, and a bulk terminal, the control gate terminal of said pull-up transistor connected to the output, the source terminal of said pull-up transistor connected to the high voltage source, the drain terminal of said pull-up transistor connected to the control gate terminals of said first switching transistor and said second switching transistor, and the bulk terminal of said pull-up transistor connected to the high voltage source, wherein the pull-up transistor will maintain the switching state of the first and second switching transistors once the low or high voltage source has been selected; and a voltage-limiting transistor having a source terminal, a drain terminal, a control gate terminal, and a bulk terminal, the control gate terminal of said voltage-limiting transistor connected to the low voltage source, and the drain terminal of said voltage-limiting transistor connected to the control gate terminals of said first switching transistor and said second switching transistor, the source terminal of said voltage-limiting transistor connected to the drain terminal of said pull-up transistor, and the bulk terminal of said voltage-limiting transistor connected to the high voltage source, wherein the voltage-limiting transistor will limit the voltage potential across the pull-up transistor.

4. The level shifter circuit of claim 3, wherein the isolation transistor is an N-type transistor, the first switching transistor is an N-type transistor, the second switching transistor is a P-type transistor, the pull-up transistor is a P-type transistor, and the voltage-limiting transistor is a P-type transistor.

5. The level shifter circuit of claim 3, wherein the low voltage source is a ramped voltage supply of 0 to 7 volts, the high voltage source is a ramped voltage supply of 5 to 16 volts, and the control voltage source is a 5-volt power supply.

* * * * *